United States Patent
Neudecker

(10) Patent No.: US 10,629,354 B2
(45) Date of Patent: Apr. 21, 2020

(54) INDUCTIVE COMPONENT

(71) Applicant: TDK Electronics AG, München (DE)

(72) Inventor: Martin Neudecker, München (DE)

(73) Assignee: TDK ELECTRONICS AG, München (DE)

(*) Notice: Subject to any disclaimer, the term of this patent is extended or adjusted under 35 U.S.C. 154(b) by 0 days.

(21) Appl. No.: 16/308,020

(22) PCT Filed: May 17, 2017

(86) PCT No.: PCT/EP2017/061893
§ 371 (c)(1),
(2) Date: Dec. 7, 2018

(87) PCT Pub. No.: WO2017/211559
PCT Pub. Date: Dec. 14, 2017

(65) Prior Publication Data
US 2019/0180906 A1   Jun. 13, 2019

(30) Foreign Application Priority Data
Jun. 8, 2016  (DE) .......... 10 2016 110 579

(51) Int. Cl.
*H01F 27/08* (2006.01)
*H01F 27/32* (2006.01)
*H01F 41/10* (2006.01)
*H01F 27/02* (2006.01)
*H01F 27/28* (2006.01)
(Continued)

(52) U.S. Cl.
CPC .......... *H01F 27/08* (2013.01); *H01F 27/022* (2013.01); *H01F 27/085* (2013.01); *H01F 27/2823* (2013.01); *H01F 27/325* (2013.01); *H01F 41/10* (2013.01); *H01F 41/127* (2013.01);
(Continued)

(58) Field of Classification Search
CPC ........ H01F 27/08; H01F 27/085; H01F 27/10; H01F 27/105; H01F 27/12; H01F 27/125; H01F 27/14; H01F 27/16; H01F 27/18; H01F 27/20; H01F 27/22
See application file for complete search history.

(56) References Cited

U.S. PATENT DOCUMENTS

| 2006/0187695 | A1 | 8/2006 | Eibl | |
| 2011/0242775 | A1* | 10/2011 | Schaible | ............... H01F 17/04 361/752 |
| 2014/0233184 | A1* | 8/2014 | Thompson | ............ A61N 1/3787 361/692 |

FOREIGN PATENT DOCUMENTS

| DE | 202005006706 U1 | 8/2005 |
| DE | 102011076227 A1 | 11/2012 |

(Continued)

OTHER PUBLICATIONS

Prof. Dr.-Ing.Martin März, "Thermisches Management in der Leistungselektronik—Anwendungs—und Auslegungsbeispiele," peak-seminars@iisb.fraunhofer.de, www.iisb.fraunhofer.de (38 pages).

Primary Examiner — Jeremy C Norris
(74) Attorney, Agent, or Firm — Nixon Peabody LLP

(57) ABSTRACT

An inductive component having a coil with a winding of a wire and a molded body adhering to the coil. The molded body has a surface for the arrangement of a heat sink. A method for producing such a component is also specified, in which, to produce the molded body, a mold is filled with a potting material and the mold is subsequently removed.

19 Claims, 2 Drawing Sheets

(51) Int. Cl.
*H01F 41/12* (2006.01)
*H05K 1/02* (2006.01)
*H05K 1/18* (2006.01)
*H01F 17/06* (2006.01)

(52) U.S. Cl.
CPC ........... *H05K 1/0203* (2013.01); *H05K 1/181* (2013.01); *H01F 17/062* (2013.01); *H05K 2201/1003* (2013.01)

(56) References Cited

FOREIGN PATENT DOCUMENTS

| | | |
|---|---|---|
| DE | 102012106615 A1 | 1/2014 |
| EP | 0831499 A2 | 3/1998 |
| EP | 2387045 A1 | 11/2011 |
| EP | 2874162 A1 | 5/2015 |
| EP | 2908320 A1 | 8/2015 |
| FR | 3024584 A1 | 2/2016 |
| JP | H11 312611 A | 11/1999 |
| JP | 2007-234752 A | 9/2007 |
| JP | 2007-235054 A | 9/2007 |
| JP | 2007-266639 A | 10/2007 |
| JP | 2011-018932 A | 1/2011 |
| JP | 2015-188016 A | 10/2015 |
| WO | WO 88 05545 A1 | 7/1988 |
| WO | WO 2005 117039 A1 | 12/2005 |

* cited by examiner

INDUCTIVE COMPONENT

CROSS-REFERENCE TO RELATED APPLICATIONS

This application is a U.S. National Stage of International Application No. PCT/EP2017/061893, filed May 17, 2017, which claims the benefit of Germany Patent Application No. 102016110579.1, filed Jun. 8, 2016, both of which are incorporated herein by reference in their entireties.

The present invention relates to an inductive component, such as, for example, an inductor or a transformer. The physical size of inductive components is determined by the required storage capacity of magnetic energy and also significantly by the dissipation of heat. The better losses are able to be dissipated, the smaller inductive components can be dimensioned.

DE 10 2011 076 227 A1 describes an inductive component comprising a coil, which is accommodated in a housing. A thermally conductive cushion is arranged between the coil and the housing.

It is an object of the present invention to specify an inductive component with improved properties.

This object is achieved by way of an inductive component according to the present claim 1.

According to a first aspect of the present invention, an inductive component comprising a coil having a winding of a wire is specified. The component has a molded body adhering to the coil. The molded body has a surface for the arrangement of a heat sink, for example a cooling element. The geometry of the surface is formed, in particular, in a manner complementary to the surface of the heat sink. For example, the surfaces of the molded body and of the heat sink are of flat design.

The molded body fills, for example, the unevennesses of the coil, in particular of the winding. The molded body is mounted, in particular, directly on the winding. The surface of the molded body formed in a complementary, for example flat, manner permits the heat sink to be arranged directly on the molded body and makes good thermal coupling of the heat sink to the component possible.

The molded body has a material having good thermal conductivity. For example, said material is a plastic material, in particular polyurethane. The plastic material can be provided for the purpose of increasing the thermal conductivity with a filler having good thermal conductivity.

The molded body is formed, for example, as a potting. In this case, a liquid potting material is applied to the coil and cured. For shaping, a mold is provided, for example, in which the coil is arranged and which is filled with the liquid potting material. The mold can be removed later. The molded body is therefore a cured material, which is integrally formed on the coil.

In one embodiment, the molded body forms at least one part of the surface of the component. The component therefore does not have a housing arranged over the molded body. Instead, the molded body can be considered as a housing or housing part of the component.

In one embodiment, the molded body only partly surrounds the coil. In particular, the molded body does not form a complete potting of the coil. A molded body that is not fully surrounding is cost-effective and sufficient for producing the connection to a heat sink.

For example, the molded body covers at most half of a side face of the coil. The side face is arranged, for example, perpendicularly to the surface of the component that is formed for arrangement of the heat sink. The side face is, for example, the lateral face of an annular coil.

The winding can be partly exposed. The component is therefore at least partly of open form. This can contribute to the improvement of the heat dissipation.

In one embodiment, the molded body is formed in the shape of a cap. For example, the molded body covers a top side of the coil. The molded body can also extend to a certain extent onto a side face of the coil.

In one embodiment, the component has a base. Said base is, for example, a plastic base. The base can be formed as a plate. In contrast to the molded body, the base does not adhere directly to the coil and does not fill any unevennesses of the coil. The coil is fastened to the base, for example, by means of an adhesive. Wire ends can be led through the bases. The base serves, for example, for the defined leading of the wire ends and for the mechanical stabilization of the component.

For example, the molded body is arranged on a first side of the component and the base is arranged on a second side of the component. The first side can be located opposite the second side. The first side is, for example, a top side of the component. For example, the molded body is not arranged between the base and the coil.

To further improve the thermal connection to a heat sink, a layer of a material, in particular of a thermally conductive material, can additionally be applied to the molded body. For example, said material is a thermally conductive paste. The layer is, for example, more flexible than the molded body and can fill gaps between the molded body and the heat sink. In addition, the layer can cause the heat sink to adhere to the molded body.

According to a further aspect of the present invention, a component arrangement having an inductive component and a heat sink, for example a cooling element, is specified. The inductive component can be formed as described above.

In one embodiment, the heat sink directly abuts against the molded body of the inductive component. The molded body can be formed as described above, in particular can have a surface, which is formed in a manner complementary to the surface of the heat sink and against which the heat sink abuts.

In one embodiment, a layer of a thermally conductive material is arranged between the molded body and the heat sink, wherein the heat sink abuts directly against said layer. The layer is formed, for example, as described above. Said layer can be, in particular, a thermally conductive paste or a thermally conductive adhesive. The layer can also abut directly against the molded body. There is therefore no rigid housing located between the molded body and the heat sink.

In both embodiments, the heat sink can also abut partly against the molded body and partly against the layer.

The heat sink is formed, for example, as a cooling element, in particular as an active or a passive cooling element. The heat sink can have cooling ribs. For example, the heat sink comprises a metal.

For example, the heat sink is arranged on the inductive component. The heat sink can also be arranged next to the inductive component.

In one embodiment, the component arrangement has a printed circuit board, to which the inductive component and the heat sink are fastened. In this case, the heat sink can be fastened to the printed circuit board directly or can be fastened to the printed circuit board only indirectly. For example, the inductive component is fastened directly to the printed circuit board and the heat sink is fastened to the inductive component.

According to a further aspect of the present invention, a method for producing an inductive component and/or a component arrangement is specified. The inductive component and the component arrangement can be formed as described above.

In the method, a coil is provided and arranged in a mold. Before or after arranging the coil in the mold, the mold is filled with a potting material to form the molded body. In particular, the potting material is present in liquid form. Said potting material is, for example, a plastic material. The potting material is subsequently cured and the mold is removed. The mold is shaped, in particular, in such a way that the molded body obtained has a surface that is formed in a complementary manner to the surface of a heat sink.

In the present disclosure, a plurality of aspects of an invention are described. All of the properties disclosed in relation to the component, the component arrangement or the method are also disclosed accordingly in relation to the other aspects, even if the respective property is not explicitly mentioned in the context of the other aspects. Furthermore, the description of the subjects specified here is not limited to the individual specific embodiments. Rather, the features of the individual embodiments—insofar as it makes technical sense—can be combined with one another.

The subjects described here are explained in more detail in the following text with reference to schematic exemplary embodiments.

In the figures.

In the following figures, identical reference symbols preferably refer to functionally or structurally corresponding parts of the various embodiments.

Figure 1:
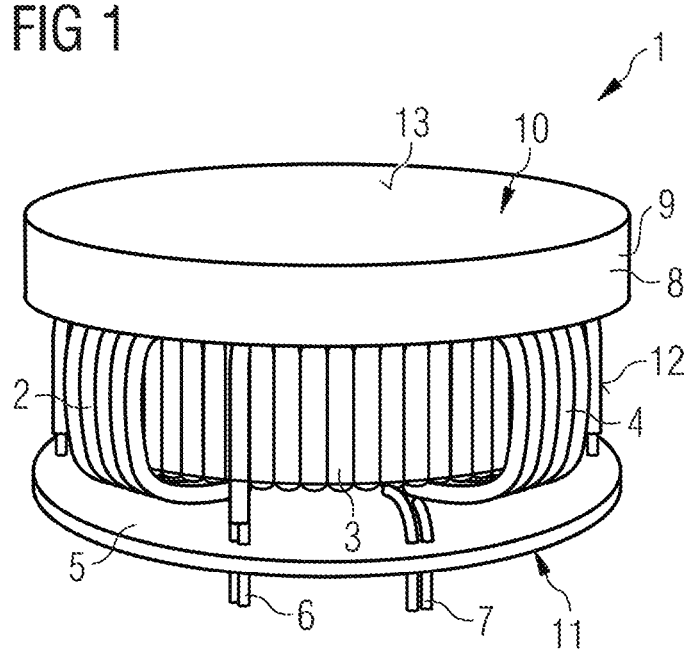
FIG. 1 shows a perspective view of an embodiment of an inductive component.

FIG. 1 shows an inductive component 1. The component 1 is, for example, an inductor or a transformer, in particular a component of the power electronics system. For example, said component is a toroidal core inductor, for example a current-compensated toroidal core inductor or a toroidal core storage inductor.

The component 1 has a winding 2 of a wire. The wire is, for example, a copper wire. The winding 2 surrounds a core 3 composed of a magnetic material. Said core is, for example, a ferrite core. The core 3 can have a closed shape, for example an annular shape. The winding 2 forms, together with the core 3, a coil 4. The coil 4 can also be formed without a magnetic core 3.

The coil 4 is arranged on a base 5. Wire ends 6, 7 of the winding 2 are led through the base 5. The base 5 is formed as a thin plate. For example, the coil 4 is arranged lying on the base 5. In particular, the coil 4 is arranged in such a way that the height thereof, that is to say the extent thereof perpendicular to the base 5, is lower than the greatest extent thereof in a direction parallel to the base 5. The component 1 is mounted, for example, on a printed circuit board together with the base 5.

The component 1 has a molded body 8, which has a thermally conductive material 9. The molded body 8 is dimensionally stable, that is to say it keeps its shape on its own. For example, the molded body 8 is formed as a potting. The molded body 8 is applied to the coil 4, for example, in liquid form and cured. The molded body 8 adheres firmly to the coil 4 after the curing. No further adhesive means or force action from outside is necessary.

The thermal conductivity of the material 9 is, for example, in a range of from 0.1 to 2300 W/(m*K). In particular, the thermal conductivity can be in a range of from 0.2 to 4 W/(m*K).

The thermally conductive material 9 of the molded body 8 is, for example, a thermally conductive plastic. In this case, said thermally conductive plastic can be a polyurethane material. The material 9 can have a thermally conductive filler for the purpose of increasing the thermal conductivity.

The molded body 8 forms a first side 10 of the component 1. The first side 10 is, for example, a top side of the component 1. The base 5 forms, for example, a second side 11 of the component 1, which second side is located opposite the first side 10. The molded body 8 and the base 5 are arranged, in particular, on opposite sides 10, 11 of the coil 4.

The molded body 8 forms a part of the outer surface of the component 1. The component 1 does not have an additional housing arranged over the molded body 8. The molded body 8 can therefore be considered as a housing or housing part of the component 1.

The molded body 8 only partly surrounds the coil 4. For example, the molded body 8 forms at most 50% of the outer surface of the component 1. The molded body 8 can be formed in the shape of a cap. The molded body 8 forms, for example, the top side of the component 1. The molded body 8 can also form a part of the side face 12 of the component 1. For example, the molded body 8 reaches from the top side of the side face 12 and covers, for example, at most half, in particular at most a third, of the side face 12.

The coil 4 is partly exposed. In particular, the coil 4 is surrounded at the side face 12 only partly by the molded body 8. The side face 12 can also be completely exposed. The coil 4, and in particular the winding 2, therefore form at least one part of the outer surface of the component 1. The coil 4 is therefore not completely surrounded by a potting or a housing. The component 1 is, in particular, at least partly of open form.

The molded body 8 and the base 5 are formed, for example, in such a way that the winding 2 does not project laterally beyond the molded body 8 and the base 5. The winding 2 is therefore protected against mechanical damage.

The molded body 8 fills the unevennesses of the winding 2 and has a flat surface 13. The flat surface 13 can have a surface roughness. The flat surface 13 therefore forms a flat surface of the component 1. In particular, the component 1 has the flat surface 13 on the first side 10 thereof facing away from the base 5. The molded body 8 can have a moderate elasticity for the purpose of compensating for tolerances.

The flat surface 13 makes good thermal connection of the component 1 to a heat sink, in particular a cooling element, possible. The surface of the heat sink is preferably formed in a manner complementary to the surface 13 of the component 1. In the case of a bent, for example convex or concave, surface of the heat sink, the surface 13 of the component 1 is preferably formed in a corresponding manner.

The molded body 8 is therefore particularly advantageous for a component 1 whose surface state without the molded body 8 prevents or impedes direct thermal connection to a heat sink. The direct connection of the molded body 8 to the heat sink without a housing situated in between leads to an increase in the thermal conductivity. The cooling that is improved as a result thereof often makes it possible to reduce the physical size, since the physical size, in particular in the case of convection cooling, is frequently determined primarily by the demands on the cooling or level of power losses.

Owing to the molded body 8, electrical insulation of the component 1 can also be achieved at the same time. In particular, a minimum spacing between the winding 2 and the surface 13 of the component 1 can be set through suitable selection of the thickness of the molded body 8.

To produce the component 1, for example, a coil 4 is provided and arranged in a mold. To form the molded body 8, the mold is filled with a liquid, thermally conductive material 9 and said material is cured. The curing is carried out, for example, over several hours, for example between 12 and 24 hours, at room temperature or at an increased temperature. The mold is subsequently removed and the component 1 is therefore demolded. The molded body 8 can also be integrally adhesively formed on the coil 4 in another way and subsequently cured.

Figure 2:
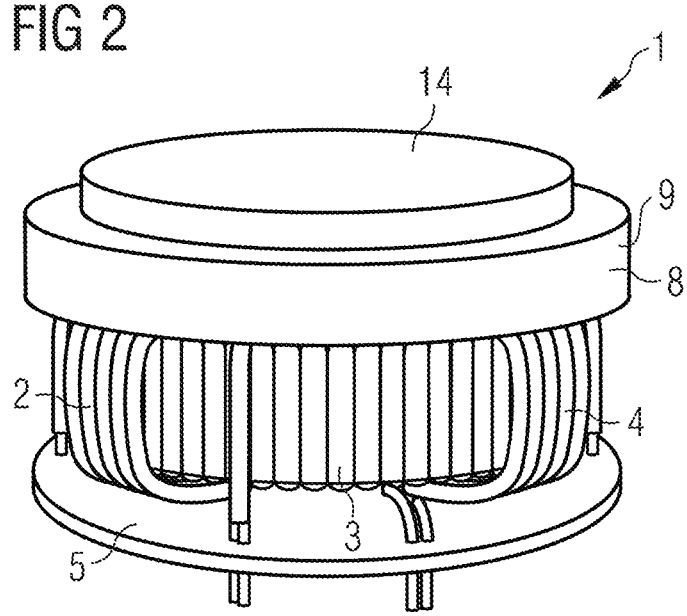
FIG. 2 shows a perspective view of a further embodiment of an inductive component.

FIG. 2 shows a further embodiment of an inductive component 1. In contrast to the component 1 from FIG. 1, a layer 14 is additionally arranged on the molded body 8. The layer 14 serves to further improve the connection of the component 1 to a heat sink.

The layer 14 has a thermally conductive material. The material of the layer 14 can differ from the material 9 of the molded body 8.

For example, the layer 14 is a thermally conductive paste or a thermally conductive adhesive. The layer 14 can be present, in particular, in a liquid or paste-like form. The layer 14 is not cured. In particular, said layer is not a part of a rigid housing. A film composed of thermally conductive material (TIM film) can also be used, which film is, for example, unwound from a roll and adhesively bonded to the component 1 of FIG. 1.

The layer 14 produces, for example, a close connection with a heat sink. For example, the layer 14 is formed as an adhesive layer, which adheres to the molded body 8 and to the heat sink. The layer 14 is applied, for example, just before the arrangement of a heat sink on the component 1.

The layer 14 is, for example, flexible so that it can be adjusted optimally to the surface 13 of the molded body 8 and of a heat sink. In particular, the layer 14 is significantly more flexible than the molded body 8. The layer 14 can be formed to be thin in comparison to the molded body 8.

Figure 3:
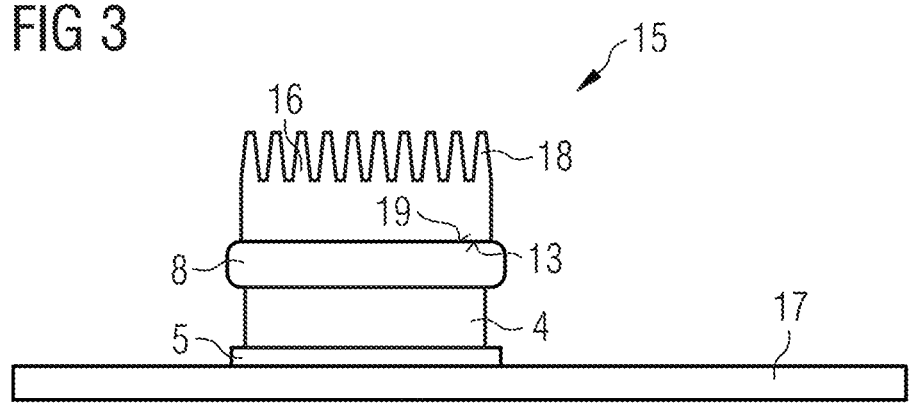
FIG. 3 shows a lateral conceptual view of an arrangement of an inductive component and of a heat sink.

FIG. 3 shows a component arrangement 15 of an inductive component 1 and of a heat sink 16 on a printed circuit board 17. The heat sink 16 is formed as a cooling element, for example. The inductive component 1 is formed, for example, as per FIG. 1 or as per FIG. 2.

The heat sink 16 is arranged directly on the molded body 8 or on a layer 14 located on the molded body 8 (FIG. 2). The surface 13 of the molded body 8 is formed in a manner complementary to a surface 19 of the heat sink 16. The heat sink 19 therefore abuts directly against the surface 13 of the molded body 8, without there being a relatively large air gap present between the heat sink 18 and the molded body 8. In an alternative assembly, the heat sink 16 can also be arranged on the printed circuit board 17 next to the inductive component 1. In this case, too, the heat sink 16 abuts directly against the surface 13 of the molded body 8.

The heat sink 16 can be formed as a cooling element, in particular as a passive cooling element, for example by convection, or as an active cooling element, for example by forced convection by way of fans. The heat sink 16 has cooling ribs 18, for example. The heat sink 16 can be formed of metal.

The component arrangement 15 is fastened to the printed circuit board 17. For example, said printed circuit board is a non-potted printed circuit board 17.

LIST OF REFERENCE SIGNS 1 inductive component
2 winding
3 core
4 coil
5 base
6 wire end
7 wire end
8 molded body
9 thermally conductive material
10 first side
11 second side
12 side face
13 flat surface
14 layer
15 component arrangement
16 heat sink
17 printed circuit board
18 cooling ribs

The invention claimed is:

1. An inductive component, comprising:
a coil having a winding of a wire;
a molded body adhering to the coil; and
a base on which the coil is arranged,
wherein the molded body has a surface for the arrangement of a heat sink and is arranged on a first side of the component, the base being arranged on an opposite second side of the component, and wherein the molded body does not reach to the base.

2. The inductive component according to claim 1, in which the molded body is formed as a potting.

3. The inductive component according to claim 1, in which the molded body only partly surrounds the coil.

4. The inductive component according to claim 1, in which the molded body covers at most half of a side face of the coil.

5. The inductive component according to claim 1, in which the molded body is formed in the shape of a cap.

6. The inductive component according to claim 1, in which the molded body forms at least one part of the surface of the component.

7. The inductive component according to claim 1, in which the winding is partly exposed.

8. The inductive component according to claim 1, in which the molded body contains a plastic material, which is provided with a filler having good thermal conductivity.

9. The inductive component according to claim 1, in which inductive component the molded body is not arranged between the base and the coil.

10. The inductive component according to claim 1, in which the surface is of flat design.

11. The inductive component according to claim 1, in which the molded body covers only a top side of the coil.

12. A component arrangement having the inductive component according to claim 1 and a heat sink, wherein the heat sink abuts directly against the molded body or wherein a layer having a thermally conductive material is arranged between the molded body and the heat sink.

13. The component arrangement according to claim 12, in which the surface of the molded body is formed in a manner complementary to the surface of the heat sink.

14. The component arrangement according to claim 13, in which the layer is formed as a thermally conductive paste, thermally conductive adhesive or as a thermally conductive film.

15. The component arrangement according to claim 13, having a printed circuit board, to which the inductive component and the heat sink are fastened.

16. A method for producing an inductive component and/or a component arrangement of claim 13, having the following steps of:
  A) providing a coil and arranging the coil in a mold,
  B) filling the mold with a potting material to form the molded body before or after arranging the coil in the mold,
  C) curing the potting material and removing the mold.

17. The inductive component according to claim 1, in which the molded body is configured to fill unevennesses of the coil.

18. The inductive component according to claim 1, wherein the coil has wire ends that are led through the base, and wherein the inductive component is configured to be positioned on a printed circuit board.

19. An inductive component, comprising:
  a coil having a winding of a wire;
  a molded body adhering to the coil; and
  a base on which the coil is arranged,
  wherein the molded body has a surface for the arrangement of a heat sink and is not arranged between the base and the coil.

* * * * *